United States Patent
Chuang et al.

(10) Patent No.: US 6,936,919 B2
(45) Date of Patent: Aug. 30, 2005

(54) HEATSINK-SUBSTRATE-SPACER STRUCTURE FOR AN INTEGRATED-CIRCUIT PACKAGE

(75) Inventors: Shih-Fang Chuang, McKinney, TX (US); Jeremias P. Libres, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 206 days.

(21) Appl. No.: 10/224,907

(22) Filed: Aug. 21, 2002

(65) Prior Publication Data

US 2004/0036162 A1 Feb. 26, 2004

(51) Int. Cl.⁷ ............................................. H01L 23/34
(52) U.S. Cl. ...................... 257/717; 257/706; 257/707; 257/712
(58) Field of Search ................................ 257/706, 707, 257/712, 717, 672, 675, 719, 720, 796

(56) References Cited

U.S. PATENT DOCUMENTS

| | | | | |
|---|---|---|---|---|
| 4,637,456 A | * | 1/1987 | Niggemann | 165/104.33 |
| 5,311,402 A | * | 5/1994 | Kobayashi et al. | 361/760 |
| 5,396,403 A | * | 3/1995 | Patel | 361/705 |
| 5,810,607 A | * | 9/1998 | Shih et al. | 439/66 |
| 5,889,323 A | * | 3/1999 | Tachibana | 257/704 |
| 5,907,474 A | * | 5/1999 | Dolbear | 361/705 |
| 5,909,056 A | * | 6/1999 | Mertol | 257/704 |
| 6,008,536 A | * | 12/1999 | Mertol | 257/704 |
| 6,011,304 A | * | 1/2000 | Mertol | 257/706 |
| 6,212,070 B1 | * | 4/2001 | Atwood et al. | 361/704 |
| 6,212,074 B1 | * | 4/2001 | Gonsalves et al. | 361/717 |
| 6,218,730 B1 | * | 4/2001 | Toy et al. | 257/704 |
| 6,282,096 B1 | * | 8/2001 | Lo et al. | 361/704 |
| 6,413,353 B2 | | 7/2002 | Pompeo et al. | |
| 6,515,360 B2 | * | 2/2003 | Matsushima et al. | 257/704 |
| 6,528,876 B2 | * | 3/2003 | Huang | 257/706 |
| 6,730,993 B1 | * | 5/2004 | Boyer et al. | 257/675 |
| 2002/0125564 A1 | * | 9/2002 | Shibata | 257/706 |
| 2003/0209465 A1 | * | 11/2003 | Shoji | 206/710 |

FOREIGN PATENT DOCUMENTS

| | | | | |
|---|---|---|---|---|
| JP | 404225263 | * | 8/1992 | ........... H01L/23/28 |
| JP | 06334075 | * | 5/1993 | ......... H01L/23/373 |

OTHER PUBLICATIONS

Zitz et al., "Direct Lid Attach Packaging for Ceramic Chip–Carrier Applications," MicroNews Second Quarter 1999, vol. 5, No. 2.

* cited by examiner

*Primary Examiner*—Mary Wilczewski
*Assistant Examiner*—Monica Lewis
(74) *Attorney, Agent, or Firm*—Yingsheng Tung; Wade James Brady, III; Frederick J. Telecky, Jr.

(57) ABSTRACT

A packaged integrated circuit that includes a substrate 310; a chip 300 mounted on the substrate; and a heatsink 350 mounted on the chip. The heatsink has a spacer 360 attached to one of its surfaces to provide a standoff distance between the heatsink and the substrate. The substrate and the heatsink can include moats into which the spacer is adapted to fit. The moat can be a notch at the edge of the substrate or it can be a channel or depression in the substrate surface. The spacer can be made of a high-modulus or low-modulus material, or a combination of the two.

1 Claim, 7 Drawing Sheets

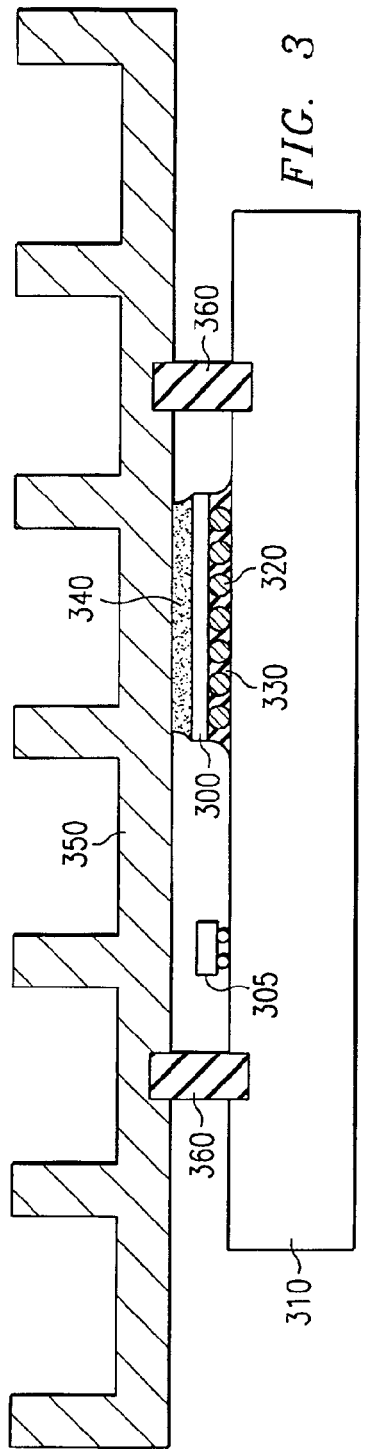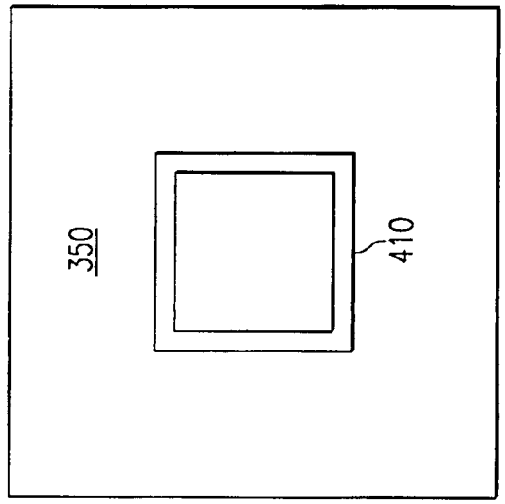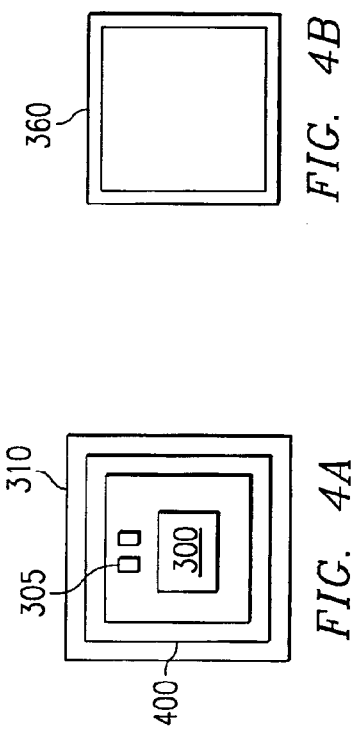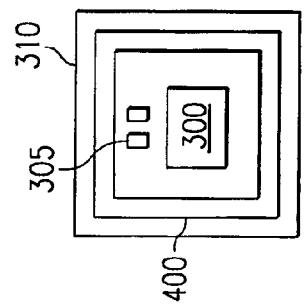

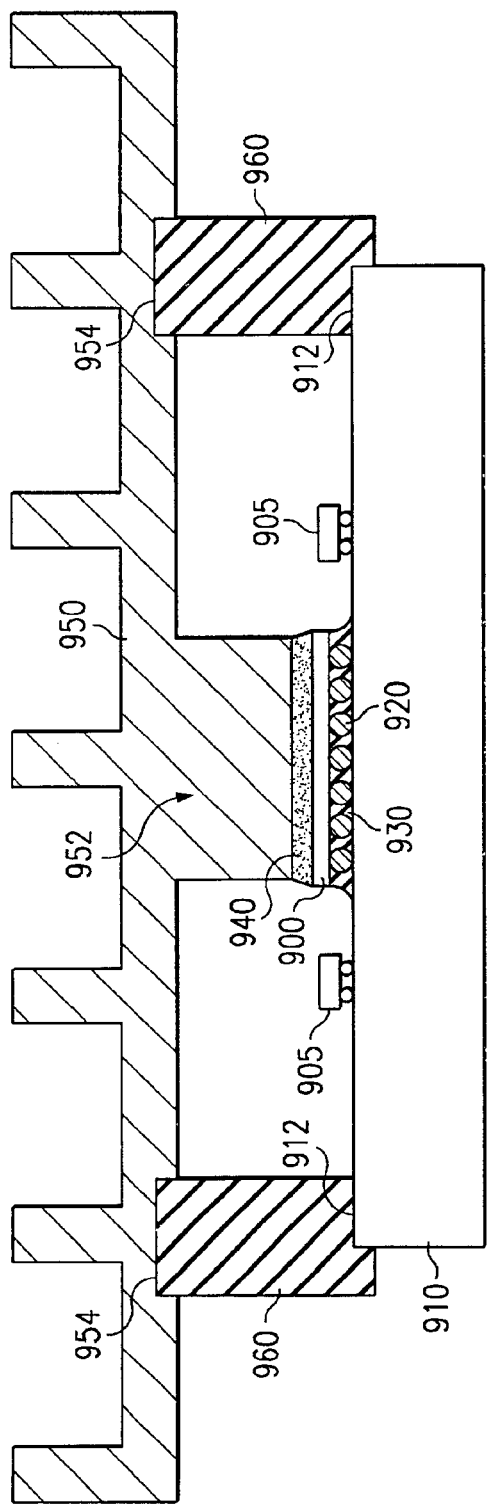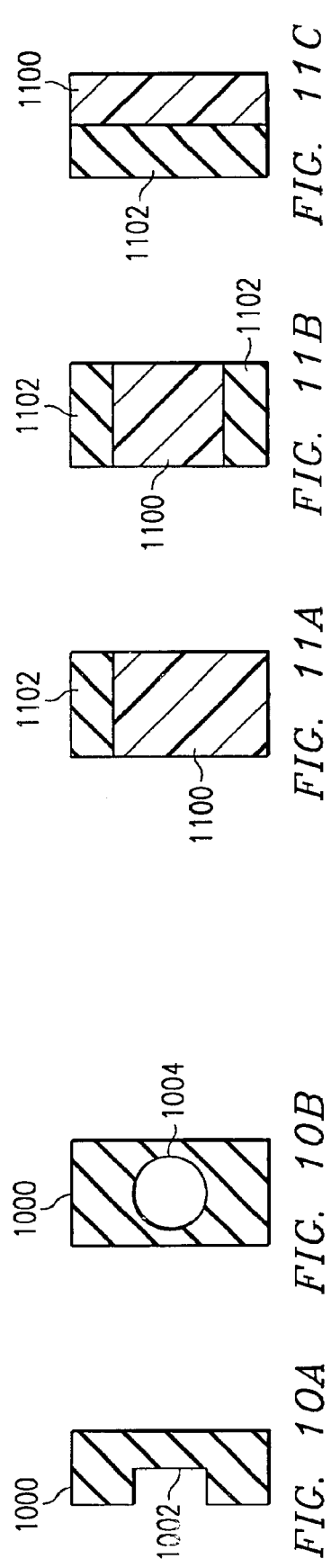
FIG. 9
FIG. 10A  FIG. 10B
FIG. 11A  FIG. 11B  FIG. 11C

HEATSINK-SUBSTRATE-SPACER STRUCTURE FOR AN INTEGRATED-CIRCUIT PACKAGE

CROSS-REFERENCE TO RELATED APPLICATIONS

This application is related to application Ser. No. 10/224,904 (attorney docket number TI-34501).

BACKGROUND OF THE INVENTION

This invention is in the field of integrated circuit packages and packaging methods.

The demand for a reduction in size and an increase in complexity and performance of electronic components has driven the industry to produce smaller and more complex integrated circuits (ICs). These same trends have forced the development of IC packages having small footprints, high lead counts, and better electrical and thermal performance. At the same time, these IC packages are required to meet accepted industry standards. Power dissipation is a particular challenge since higher performance ICs produce more thermal energy, and the smaller packages of today allow the designer few options through which to dissipate this energy. For a typical flip-chip integrated circuit, the primary means for removing heat from the package is from the backside of the chip (the front side being mounted face-down on a substrate). Unfortunately, the chip is relatively fragile and easily broken, so it is difficult to mount a relatively heavy heatsink to the chip's backside without causing damage. Another problem is that the chip is usually much smaller than a heatsink of the size required for the appropriate amount of thermal dissipation. This makes the mounting of the heatsink even more difficult, the reason being that the interface between the chip and heatsink must be carefully controlled in order to obtain high thermal performance, and a large heatsink is difficult to mount precisely on a relatively small chip. Ideally, the interface would be as thin and uniform as possible. The industry refers to the thermal interface as a "bond line", and the thickness and uniformity of the bond line is considered key to the successful manufacture of a high performance integrated circuit package.

In the traditional prior art approach to the problem of dissipating heat from an IC, shown in FIG. 1, a ceramic ball grid array package is fitted with a copper-tungsten lid that serves both as a thermal sink as well as to protect the integrated circuit. The chip 100 is mounted face-down on a ceramic substrate 110 with solder bumps 120. Underfill 130 protects the active surface of the chip and strengthens the chip-to-substrate attachment. Thermally conductive compound 140 is compressed between the chip backside and the inner surface of lid 150. Lid 150 is attached to substrate 110 with adhesive 160. Solder balls 170 connect the assembly to the next level of interconnection, such as a printed circuit board. While this packaging technology has been used for some time in industry, it suffers from various disadvantages, including poor thermal performance as a result of the difficulties involved in obtaining precise bond line characteristics. These difficulties arise from the fact that the lid itself as well as the techniques used to mounted the lid to the substrate are relatively imprecise. For example, the lid is difficult to fabricate to a high degree of precision at an economical cost, and the adhesive 160 used to attach the lid to the substrate can be inconsistent in thickness. These and other factors can result in the lid being tilted or rotated relative to the chip, which can result in poor bond line characteristics.

A second prior art approach, shown in FIG. 2, overcomes some of the disadvantages of the FIG. 1 package. This direct lid attach package again includes a chip 200 mounted face-down on a substrate 210 with solder bumps 220. Underfill 230 is inserted between chip and substrate as above. However, instead of a lid sealed to the substrate, lid 250 is only attached to the backside of chip 200. The sole mechanical support for the lid is a thermally-conductive adhesive 240. The package is completed by solder balls 270 on the bottom of the substrate. An advantage of this approach is that the relatively simple lid can be attached more efficiently and at lower cost than in the traditional approach shown in FIG. 1.

While the technology shown in FIG. 2 solves some of the problems inherent in the traditional approach, it still suffers from disadvantages. In particular, the mechanical integrity of the lid to chip interface is questionable in view of the limited area over which the bond occurs relative to the lid and chip size. The thermally-conductive adhesive necessary to support the lid is also expensive and is considered exotic by many in the industry. The primary disadvantage of the direct-lid-attach approach, however, is that precise mounting of the lid to the chip is difficult. The tendency of the lid to tilt or rotate during mounting results in a bond line between the chip and lid that is too thin in places and too thick elsewhere. This is particularly a problem for large chip sizes and when a relatively heavy heatsink (rather than a lid) is attached directly to the chip backside. Such non-uniformity in the bond line results is less than optimal thermal performance of the interface. It is therefore apparent that a need exists in the industry for an improved package and packaging method for products that benefit from efficient thermal dissipation.

BRIEF SUMMARY OF THE INVENTION

In one embodiment of the invention, a packaged integrated circuit is disclosed that includes a substrate; a chip mounted on the substrate; and a heatsink mounted on the chip. The heatsink has a spacer attached to one of its surfaces to provide a standoff distance between the heatsink and the substrate. The substrate and the heatsink can include moats into which the spacer is adapted to fit. The moat can be a notch at the edge of the substrate or it can be a channel or depression in the substrate surface. The spacer can be made of a high-modulus or low-modulus material, or a combination of the two.

In another embodiment of the invention, a packaged integrated circuit is disclosed that includes a substrate and a chip mounted on the substrate. A heatsink with a moat in one of its surface is mounted on the chip. A spacer between the substrate and the heatsink is adapted to fit in the moat on the surface of the heatsink. The spacer has dimensions sufficient to provide a standoff distance between the heatsink and the substrate. As mentioned above, the substrate can also include a moat into which the spacer fits. The substrate moat can be in the form of a notch at the edge of the substrate, in which case the spacer includes a corresponding notch so that the spacer seats properly on the substrate. In some alternatives, the substrate does not include moats or notches. Instead, the spacer is designed to fit over the edge of the substrate. Again, the spacer can be made of a high-modulus or low-modulus material, or a combination of the two.

In still another embodiment of the invention, a method of packaging an integrated circuit is disclosed that includes the steps of providing a substrate; mounting a chip on the substrate; providing a heatsink including a spacer attached to one surface thereof; and mounting the heatsink on the chip such that the spacer provides a standoff distance between the heatsink and the substrate.

An advantage of the invention is that it allows for precise mounting of a heatsink to an IC.

BRIEF DESCRIPTION OF THE SEVERAL VIEWS OF THE DRAWINGS

The drawings are intended to aid in understanding of the embodiments of the invention. One skilled in the art will appreciate that the drawings are not to scale; in particular, the vertical dimension is typically exaggerated to better show the details of the embodiments.

FIG. 3 is a cross-sectional diagram of an embodiment package in which the spacer is inserted in moats in the heatsink and the substrate.

FIGS. 4a, 4b, and 4c are plan views of the substrate, the spacer, and the heatsink, respectively, used in the embodiment of FIG. 3.

FIG. 9 is a cross-sectional diagram of an embodiment package in which the spacer overlaps the edge of the substrate.

FIG. 10a is a cross-sectional diagram of a spacer having a notched side to make it flexible and compressible.

FIG. 10b is a cross-sectional diagram of a spacer including a hole or tube to make it flexible and compressible.

FIGS. 11a, 11b, and 11c are cross-sectional diagrams of spacers composed of a composite of low- and high-modulus materials.

DETAILED DESCRIPTION OF THE INVENTION

Figure 1:
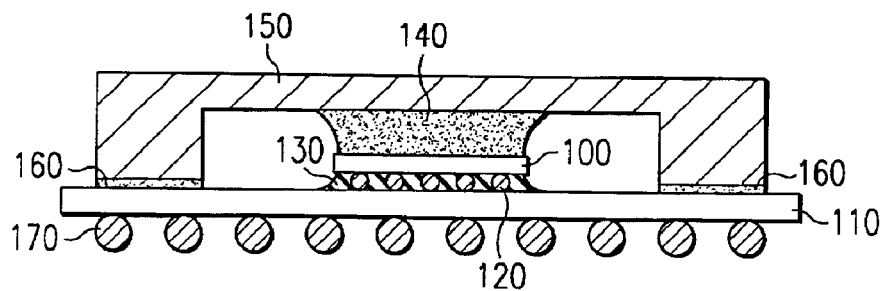
FIG. 1 is a cross-sectional diagram of a prior art lidded chip package.
Figure 2:
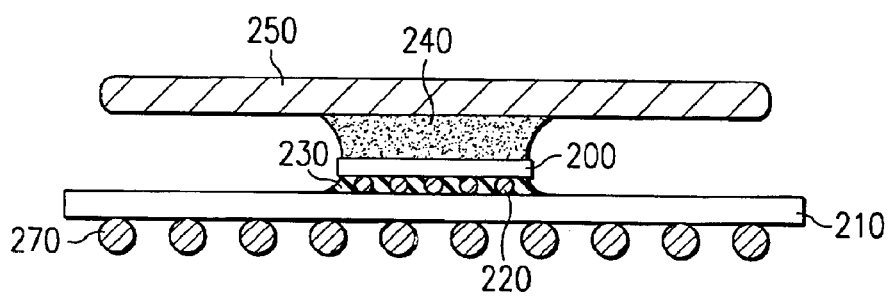
FIG. 2 is a cross-sectional diagram of a prior art lidded chip package in which the lid is supported solely by the chip-to-lid interface.

In various embodiments of the invention described herein, a thin and uniform interface (i.e. a bond line) is achieved between a chip and a heatsink by using a spacer that supports the heatsink. The spacer can take the form of a ring that surrounds the chip, or it can take the form of posts or patches at various places on the substrate to support the weight of the heatsink. Modern ICs incorporate delicate low-dielectric-constant materials that can be easily damaged by mounting the heatsink directly on the chip, or by forces applied inadvertently to the heatsink during use of the package assembly. In addition, in interconnection schemes in which the packaged IC is to be placed into a socket, the chip and chip-heatsink interface must be able to withstand the socket insertion force. The spacer not only performs the role of acting as a standoff that protects the IC during the application of these forces, but the spacer in the embodiments described herein is also the means by which a precise bond line between the chip and the heatsink is achieved.

FIG. 3 shows an embodiment of the invention in which an integrated circuit chip 300 is mounted on a substrate 310 using solder bumps 320. A passive component 305 is also mounted on substrate 310. Epoxy underfill 330 protects the active surface of the chip and strengthens the chip-to-substrate attachment. Heatsink 350 is attached to the backside of chip 300 with adhesive 340. In this embodiment, the chip is silicon about 610 um thick and approximately 20 mm×20 mm in size; the substrate is a ceramic laminate about 1.9 mm thick and includes approximately thirty layers of metal for the routing of interconnects; and the solder bumps are Sn/Pb, Sn/Ag, or similar material and about 75 um in height. Adhesive 340 forms the bond line between chip 300 and heatsink 350. The adhesive is preferably a silver or metal-oxide filled epoxy (depending on whether the adhesive is to be electrically conductive or insulative), but alternatives such as metal-filled acrylic can be used as an alternative to epoxy. No matter what adhesive is selected, the bond line should be as thin and uniform as possible. In this embodiment, the bond line is approximately 50 $\mu$m in thickness. Bond line uniformity is achieved by using spacer ring 360, which supports the weight of heatsink 350 and any forces applied to the heatsink during mounting or use. The ring 360 is about 25 mm square (i.e. big enough to encompass chip 300) and is of a height that exceeds the chip/solder ball stack height by about 50 um. While the ring is shown to be rectangular in cross-section, it can be any other appropriate shape, such as square, round, or oval in cross-section. Note that in this embodiment the ring inserts into slots or moats in both the heatsink 350 and the substrate 310 to register the relative locations of the heatsink and the substrate. The ring is approximately 3 to 5 mm wide in cross-section and the moats are slightly wider and of the same depth. The moat should be dimensioned to allow for about 50 um of adhesive on the surfaces of the ring to hold the ring into the moat. The material of which the ring is composed can be either electrically conductive or non-conductive. In this embodiment, the ring is non-conductive and is preferably made of a ceramic or an elastomer capable of withstanding high temperatures, such as silicone rubber. The factors influencing selection between a high-modulus material such as ceramic or a low-modulus material such as silicone rubber are discussed below.

Some ICs require that the backside of the chip be connected to electrical ground. In that case, the ring could be an electrically conductive material such as aluminum, a metallized ceramic, or a conductive elastomer (e.g. silver-filled silicone rubber), for example. The moat in the substrate 310 would then connect to a metal layer in the substrate that is connected to electrical ground (e.g. through a printed circuit board or card to which the substrate is mounted). The ring would be connected to both the heatsink and the substrate with a conductive adhesive such as silver-filled epoxy. The chip would be connected to the heatsink with an electrically conductive adhesive as well. This approach has the additional advantage in that the spacer and the connection to electrical ground provide additional thermal dissipation paths since the ground path typically leads to the printed circuit board on which the heatsink/chip/substrate assembly is mounted.

As indicated above, the ring can be a high-modulus material or a low-modulus material. It can also be a composite of high- and low-modulus materials. The choice depends upon the specific requirements of the chip and the intended use, but in general a high-modulus spacer would be preferred in situations involving a very fragile chip (e.g. one large in size or that incorporates delicate low-dielectric-constant dielectrics as interlayer insulation), a very heavy heatsink, or an interconnection method that demands that a high degree of force be applied to the heatsink or chip (e.g. during insertion of the assembly into a socket). On the other hand, a low-modulus material is generally preferred in situations other than those described above. The low-modulus material is compressible and capable of absorbing shocks to the heatsink while maintaining the standoff between the heatsink and substrate. The precision of the bond line obtainable with a high-modulus material depends upon the manufacturing tolerances of the heatsink, the substrate, and the spacer ring. Specifically, the dimensions of the spacer and the depth of the moat determine the space left in the stack for the bond line (recall that the bond line is the chip-heatsink interface). A low-modulus material inherently provides less precision in this regard, but instead facilitates adjustment, which is particularly advantageous when the assembly relies on mechanical support for the heatsink (as shown in FIG. 5 below) in addition to support from contact with the chip backside and the spacer.

Referring now to FIGS. 4a, 4b, and 4c, the relations between the chip, substrate and spacer of FIG. 3 are shown in plan view. FIG. 4a shows the chip 300 and passive components (e.g. capacitors) 305 mounted on substrate 310. Moat 400 surrounds the chip and components. FIG. 4b shows the spacer ring 360. FIG. 4c is the underside of the heatsink, showing moat 410. As is apparent from these drawings, the spacer is a piece-part that can be handled and mounted with standard pick-and-place equipment. The moats on the heatsink and the substrate facilitate accurate placement of the spacer.

Figure 5:
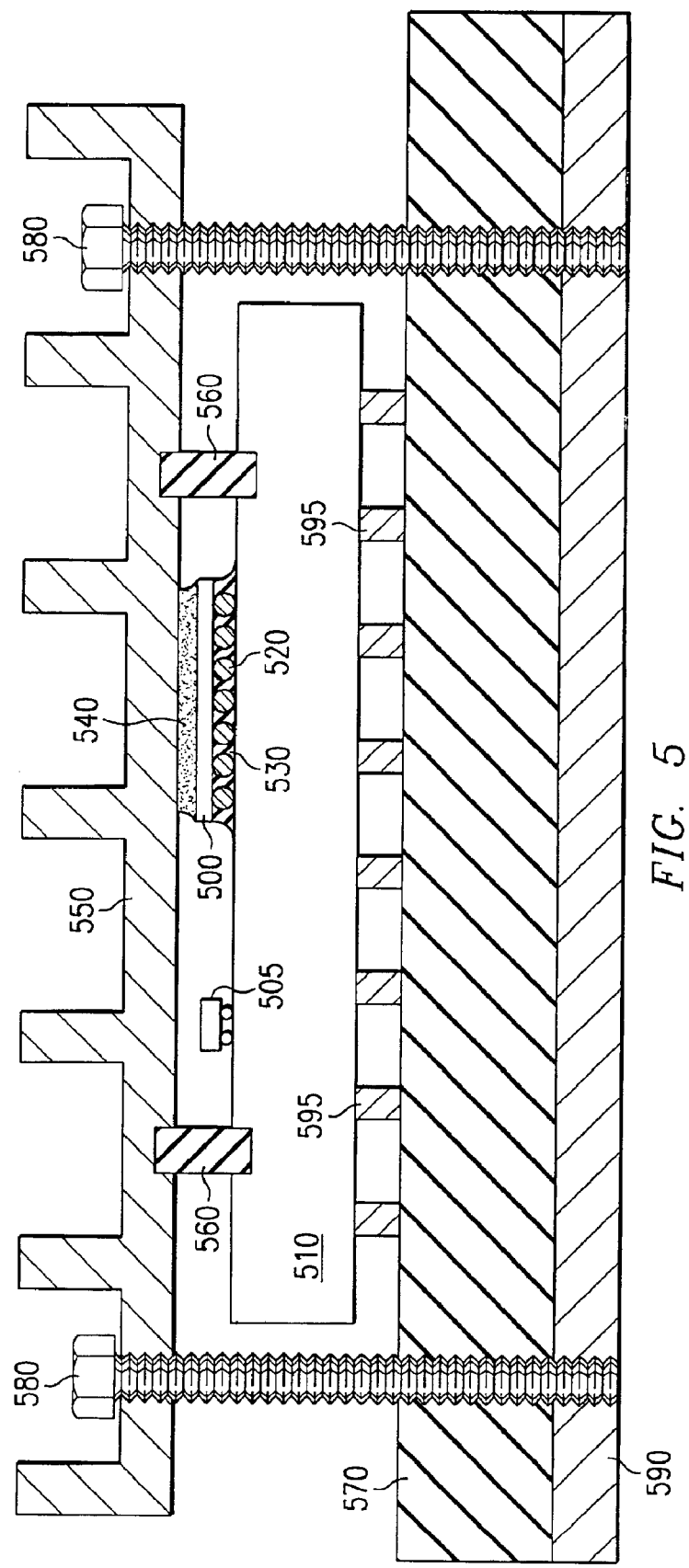
FIG. 5 is a cross-sectional diagram of an embodiment package in which the substrate/chip/heatsink is mounted to a printed circuit board using mechanical support.

FIG. 5 shows another embodiment of the invention in which heatsink 550 is mechanically attached to printed circuit board 570 with screws 580. Screws 580 insert into backing plate 590. In this embodiment, substrate 510 is coupled to printed circuit board 570 by compression contacts 595, which allow for easy replacement of the substrate/chip/heatsink assembly. Screws 580 also allow for positional adjustment of the heatsink 550 relative to the substrate 510. To facilitate this adjustability, thermal compound or grease (e.g. metal-oxide filled silicone) 540 is used to thermally couple the backside of chip 500 to the heatsink 550. As in the embodiment described above, spacer 560 can be a high- or low-modulus material or a composite of the two. The use of screws 580 lends itself to using either a low-modulus or a composite low- and high-modulus material for spacer 560 since the heatsink 550 can be positioned relative to substrate 510 and printed circuit board 570 by the screws. Spacer 560 is preferably somewhat flexible and compressible to allow for the movement resulting from the screw adjustments. Thermal compound 540 is also flexible and compressible, unlike an epoxy adhesive, for example.

Figure 6:
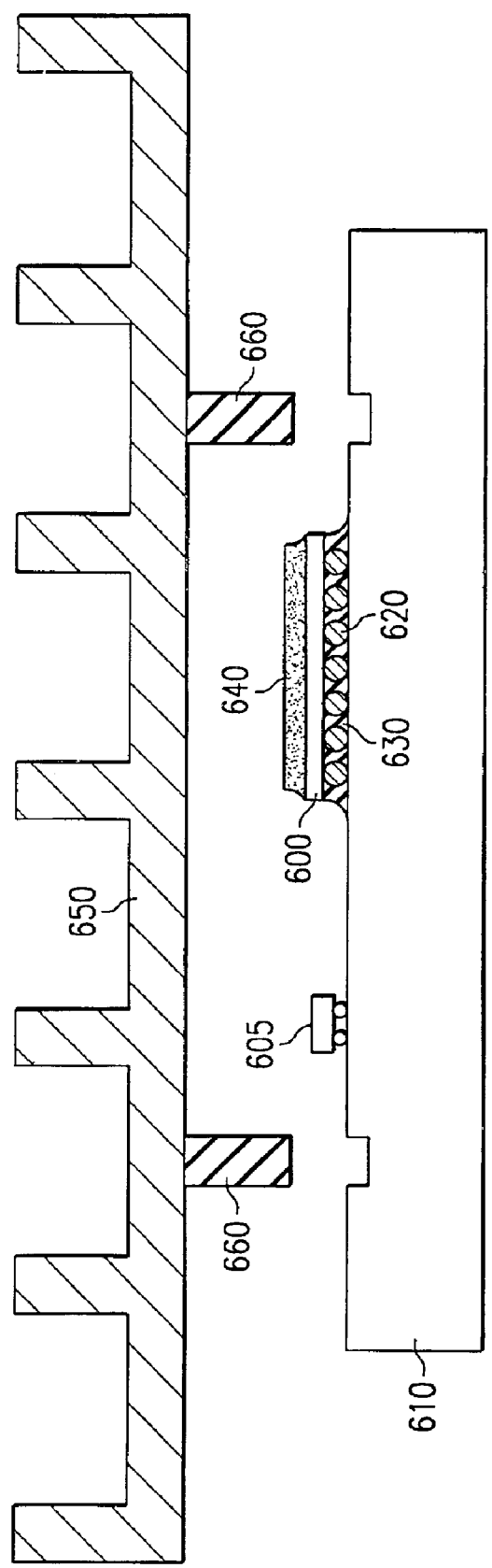
FIG. 6 is a cross-sectional diagram of an embodiment package in which the spacer is attached to the heatsink and the heatsink/spacer unit is then attached to the substrate.

FIG. 6 shows an embodiment of the invention in which spacer 660 is attached to heatsink 650 prior to mounting the heatsink on substrate 610. Spacer 660 can be mounted directly to the surface of the heatsink 650 (with epoxy adhesive for example) as shown in FIG. 6, or spacer 660 can be mounted in a moat on the heatsink as in the embodiment shown in FIG. 3. In this approach, the spacer is not a separately handled piece in the assembly process. Rather, the spacer and heatsink are a unit that can be assembled at a vendor, for example, and delivered to the assembly site.

Figure 7:
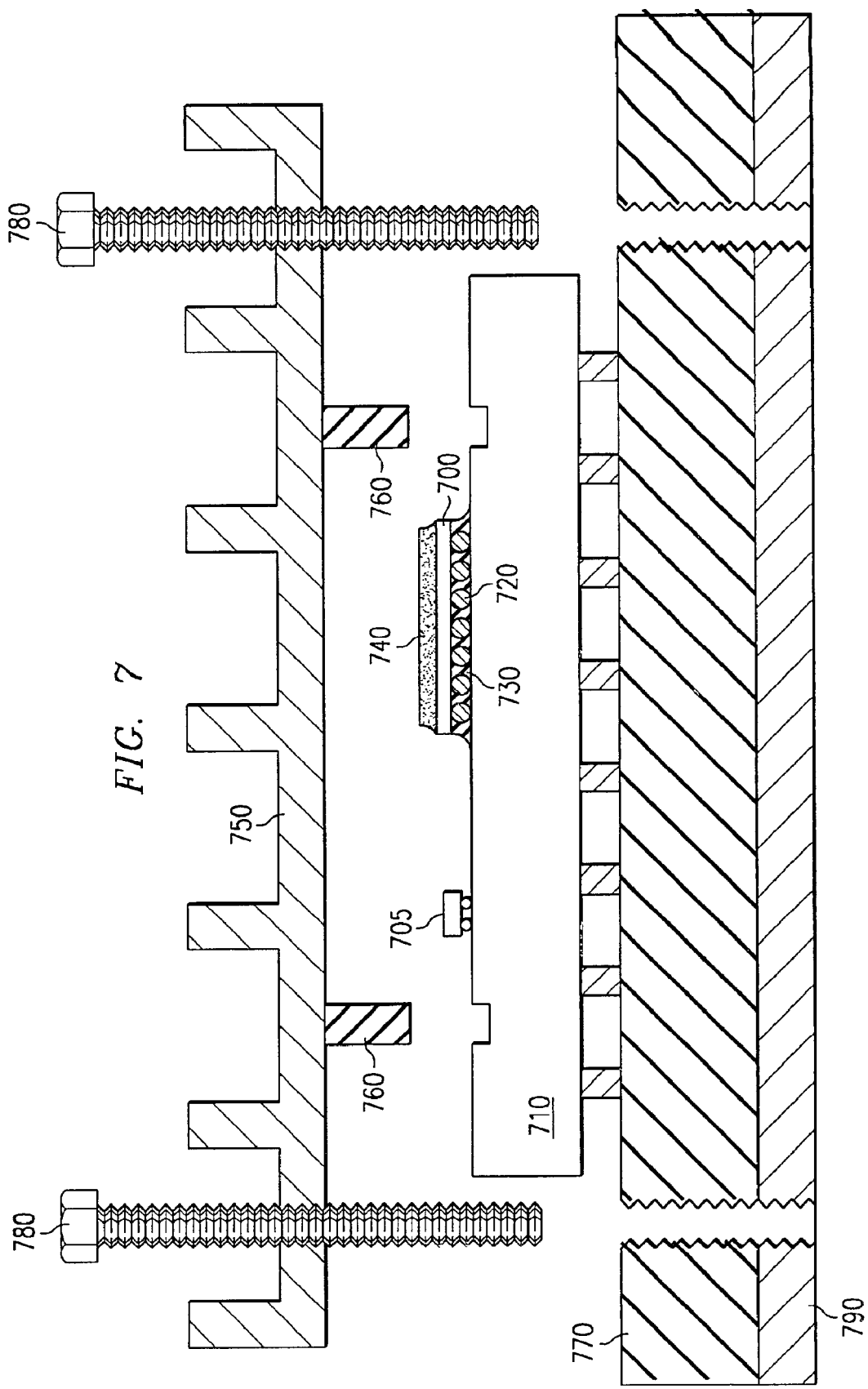
FIG. 7 is a cross-sectional diagram of an embodiment package of the type shown in FIG. 6 in which the substrate/chip/heatsink assembly is mounted to a printed circuit board using mechanical support.

FIG. 7 shows an embodiment of the invention in which the composite heatsink/spacer assembly shown in FIG. 6 is attached to printed circuit board 770 with screws 780. Screws 780 screw into backing plate 790. Once assembled, this embodiment is the same as is shown in FIG. 5.

Figure 8:
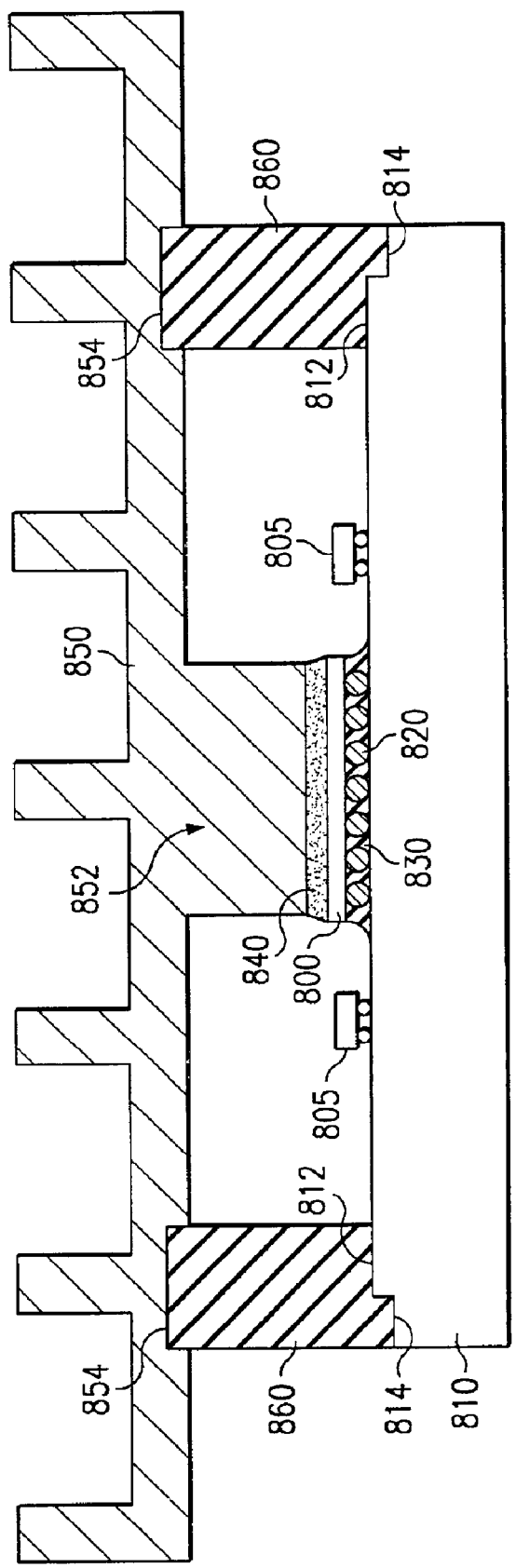
FIG. 8 is a cross-sectional diagram of an embodiment package in which the substrate moat is in the form of a notch at the edge of the substrate, and in which the spacer has a corresponding notch that aids in assembling the two components.

FIG. 8 shows an embodiment of the invention in which heatsink 850 includes an extended portion 852, the bottom of which is attached to the backside of chip 800 with adhesive or thermal compound 840. The heatsink extension allows for more room between the main portion of the heatsink 850 and the substrate 810. It also allows for a more compact heatsink since the same amount of mass can occupy less lateral space. The increased vertical distance between heatsink and substrate can be better supported with a more robust spacer ring than is shown in the previous embodiments. As shown in FIG. 8, spacer 860 is preferably wider in this embodiment. It is preferable that the spacer be as wide as possible in order to take more of the load off of chip 800. If passive components 805 are used, it is preferable that the spacer extend as close to these components as possible (to approximately 1 to 2 mm from the components). Overall, the area of the substrate surface occupied by the spacer can be as much as 50 to 60% of the total substrate surface area. Spacer 860 is seated in a moat 854 in the heatsink 850 as described above with reference to other embodiments. However, here the spacer is seated on the edge of substrate 810. It is restrained from moving by notch 812 which fits onto step 814 in the edge of substrate 810. This approach is advantageous in that the moat or notch is formed at the edge of the substrate where it is less likely to interfere with the routing of metal layers in the substrate.

FIG. 9 is an alternative to the structure shown in FIG. 8. Here, the spacer is restrained from moving relative to the substrate by notch 912 in the spacer that fits over the unmodified edge of the substrate. This approach eliminates the need to modify the substrate, a step that can introduce difficulties if a notch would affect metal layers near the surface of the substrate. Spacer 960 can be relatively wide, since its lateral dimensions are essentially unbounded by the substrate edge. As above, the spacer is slotted into moat 954 in the heatsink to help position the heatsink relative to the substrate and to prevent unwanted relative movement of the two components.

As described above, many applications may benefit from a spacer ring that is flexible and compressible. As an alternative to using low-modulus materials to achieve these characteristics, a spacer made of a relatively high modulus material such as a hard plastic could include features to make it more flexible and compressible. An example of such a hard plastic is the polyetherimide, Ultem™, from General Electric. However, it should be appreciated that a wide variety of similar materials would be suitable, including thermoset materials such as epoxies, silicones, and polyimides, as well as thermoplastic polymers such as the polyetherimide mentioned above, polyethersulfone, and semi-crystalline polymers. FIGS. 10a and 10b show two examples of such features. In FIG. 10a, a cross-section of a spacer ring 1000 includes a notched portion 1002 along one of its faces. The notch allows a further degree of bending and flexing than would exist if a solid, un-notched spacer were used. Similarly, in FIG. 10b, a hole or tube 1004 is formed in the interior of the spacer 1000 to provide additional flexibility and compressibility. Of course, these and similar configurations could be applied to relatively low-modulus materials to provide even greater flexibility and compressibility to spacers made of those materials.

As mentioned above with respect to several of the embodiments, a spacer that is a composite of low- and high-modulus materials offers several advantages. Three such spacers are shown in FIGS. 11a, 11b, and 11c. In FIG. 11a ceramic or hard plastic spacer 1100 is capped by silicone rubber 1102 for example. In FIG. 11b the high-modulus spacer core 1100 is capped on top and bottom by the low-modulus material 1102. In application, the selection between these alternatives will depend on the amount of flexibility and compressibility required of the spacer. For example, a relative heavy heatsink mounted with screws to the printed circuit board may benefit from using the configuration in FIG. 11a, since the high-modulus bottom portion provides the standoff needed to support the heavy heatsink, and the low-modulus top portion allows flexibility as the heatsink is screwed down. If the situation demands more flexibility, the proportion of low-modulus material to high-modulus material could be increased, or the configuration shown in FIG. 11b could be used. FIG. 11c shows a composite ring in which the low modulus material 1102 is attached to one side of the high modulus core 1100. This configuration would allow a certain degree of lateral movement within the moats on the heatsink and substrate, for example.

Figure 12A:
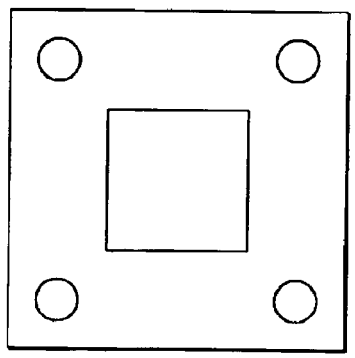
FIGS. 12a and 12b are plan views of a substrate showing spacers in the form of posts or patches.
Figure 12B:
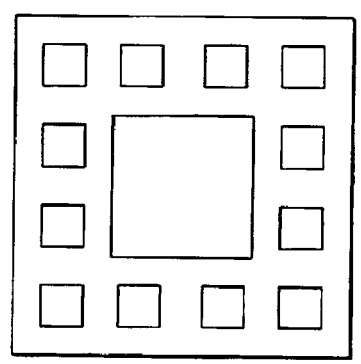

The embodiments described thus far have included a continuous spacer that surrounds the chip to provide a stable base upon which the heatsink is supported. As an alternative to a continuous ring, strategically-placed posts could be used. FIGS. 12a and 12b show two examples of this discontinuous spacer approach. FIG. 12a shows round posts placed at the substrate corners, while FIG. 12b shows many square posts placed along the edges of the substrate to approximate the load-supporting capability of the continuous ring. One advantage of this approach is that the routing of circuits on the surface of the substrate may be easier than with a continuous ring spacer, particularly if moats (the term "moat" as used herein is intended to include the sockets or depressions in which the posts are mounted) in the substrate and heatsink are needed for mounting precision as is shown with the ring spacer in FIG. 3. If they are composed of low-modulus material, such as silicone rubber or a similar material, the posts take the form of patches. Such a material can be applied in liquid or gel form and is preferably self-curing. In the alternative, a preformed pad such as the Sil-Pad™ available from Bergquist Company or the In-Sil-8™ pad from Aavid Thermalloy, L.L.C., can be used as the spacer. The Sil-Pad™, for example, is a silicone rubber binding agent on a fiberglass support. It is typically metal-filled for enhanced thermal conductivity. This or similar material could also be used to form the ring spacer described in embodiments hereinabove.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as claimed hereinbelow.

We claim:

1. A packaged integrated circuit, comprising:
   a substrate including a notch at the edge thereof:
   a chip mounted on said substrate;
   a heatsink including a moat in a surface thereof, said heatsink mounted on said chip;
   a spacer between said heatsink and said substrate;
   said spacer adapted to fit in said moat on said surface of said heatsink and including a notch adapted to fit into said notch at said edge of said substrate;
   said spacer having dimensions sufficient to provide a standoff distance between said heatsink and said substrate.

* * * * *